(12) United States Patent
Ju

(10) Patent No.: US 7,366,023 B2
(45) Date of Patent: Apr. 29, 2008

(54) FLASH MEMORY DEVICE

(75) Inventor: Gi Seok Ju, Icheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 84 days.

(21) Appl. No.: 11/488,709

(22) Filed: Jul. 19, 2006

(65) Prior Publication Data
US 2007/0097775 A1    May 3, 2007

(30) Foreign Application Priority Data
Oct. 28, 2005    (KR) .................. 10-2005-0102412

(51) Int. Cl.
*G11C 11/34* (2006.01)

(52) U.S. Cl. ................ 365/185.23; 365/185.11

(58) Field of Classification Search .......... 365/185.23, 365/185.11, 230.06
See application file for complete search history.

(56) References Cited

U.S. PATENT DOCUMENTS 6,208,561 B1 *  3/2001  Le et al. ............... 365/185.23
6,434,073 B2 *  8/2002  Guliani et al. ............... 365/210
2003/0112662 A1 *  6/2003  Tanzawa et al. ....... 365/185.11
2007/0147164 A1 *  6/2007  Lee et al. .............. 365/230.06

* cited by examiner

*Primary Examiner*—Anh Phung
(74) *Attorney, Agent, or Firm*—Lowe Hauptman Ham & Berner LLP

(57) ABSTRACT

A flash memory device includes first to $n^{th}$ banks sharing an I/O line, a page buffer unit commonly connected to a bit line of the first to $n^{th}$ banks, for buffering data to be transmitted to the first to $n^{th}$ banks, a first X-decoder connected to a word line of the first banks, for applying a driving voltage to the word line of the first banks, a $n^{th}$ X-decoder connected to a word line of the $n^{th}$ banks, for applying a driving voltage to the word line of the $n^{th}$ banks, a program/erase pump for generating a program voltage/erase voltage applied to the first to $n^{th}$ banks, a first switch unit that switches the program voltage/erase voltage and transmits the voltage to the first banks and the first X-decoder, and a $n^{th}$ switch unit that switches the program voltage/erase voltage and transmits the voltage to the $n^{th}$ banks and the $n^{th}$ X-decoder.

5 Claims, 1 Drawing Sheet

FLASH MEMORY DEVICE

BACKGROUND

1. Field of the Invention

The present invention generally relates to a memory device, and more particularly, to a flash memory device in which program and erase operations can be performed at the same time by dividing a bank.

2. Discussion of Related Art

A NAND flash memory in the related art can implement a very small cell area and is therefore suitable for high-integrated memory devices. However, the NAND flash memory is disadvantageous in that a time taken to read first data is long and a programming time is also long. Furthermore, it cannot perform other operations while performing one operation.

FIG. 1 is a block diagram illustrating the bank structure of a NAND flash memory in the related art.

Referring to FIG. 1, in the NAND flash memory, a X-decoder 20 provided between cell arrays 10 on one P-well is driven through word lines within the cell array 10. Data is transferred to page buffers 30 through cache buffers 40. While selected pages are programmed, data for performing a next page program are transferred to the cache buffers 40. Accordingly, the related art single bank structure can improve the read and program speeds.

If the cache buffers 40 are used, a data input operation can be performed while a program operation is performed. Furthermore, while data are output, a next page can be read by the page buffer 30.

In this case, however, there still remains a problem in that other operations cannot be performed while the read, program or erase operation is performed.

SUMMARY OF THE INVENTION

An embodiment of the present invention is that it provides a bank division apparatus of a flash memory device, in which one operation can be performed in one bank while a read, program or erase operation is carried out in the other bank.

A flash memory device according to an embodiment of the present invention includes first to $n^{th}$ banks sharing an I/O line, a page buffer unit commonly connected to a bit line of the first to $n^{th}$ banks, for buffering data to be transmitted to the first to $n^{th}$ banks, a first X-decoder connected to a word line of the first banks, for applying a driving voltage to the word line of the first banks, a $n^{th}$ X-decoder connected to a word line of the $n^{th}$ banks, for applying a driving voltage to the word line of the $n^{th}$ banks, a program/erase pump for generating a program voltage/erase voltage applied to the first to $n^{th}$ banks, a first switch unit that switches the program voltage/erase voltage and transmits the voltage to the first banks and the first X-decoder, and a $n^{th}$ switch unit that switches the program voltage/erase voltage and transmits the voltage to the $n^{th}$ banks and the $n^{th}$ X-decoder.

According to another embodiment of the present invention, there is provided a flash memory device including a bank contained within one well of a semiconductor substrate and a decoder for gaining access to the bank, the flash memory device including first and second wells that are formed by dividing the one well into two or more independent well, first and second banks which are separately formed in the first well and have at least ½ of the memory capacity of the bank, a first decoder formed in the first well, for gaining access to the first and second banks, third and fourth banks which are separately formed in the second well and have at least ½ of the memory capacity of the bank, and a second decoder formed in the second well, for gaining access to the third and fourth banks. When the first and second banks perform a program operation, the third and fourth banks may perform an erase operation, and when the first and second banks perform the erase operation, the third and fourth banks may perform the program operation.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The present invention will now be described in detail in connection with certain exemplary embodiments with reference to the accompanying drawings.

Figure 1:
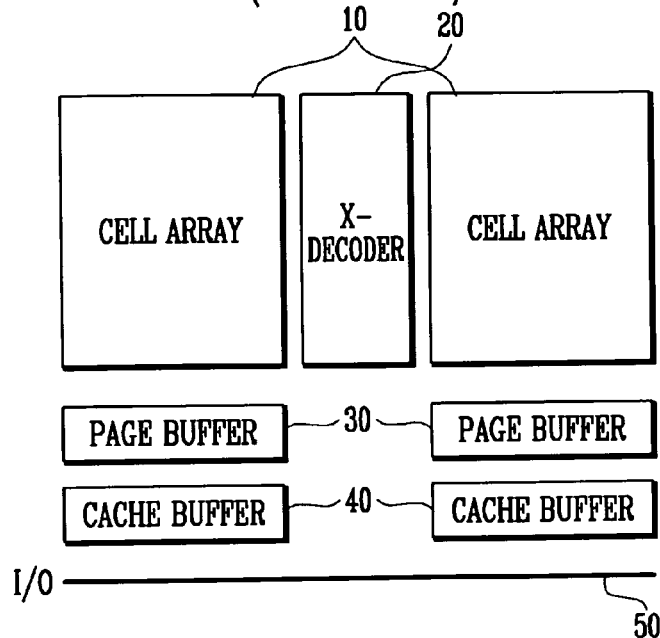
FIG. 1 is a block diagram illustrating the bank structure of a NAND flash memory in the related art.
Figure 2:
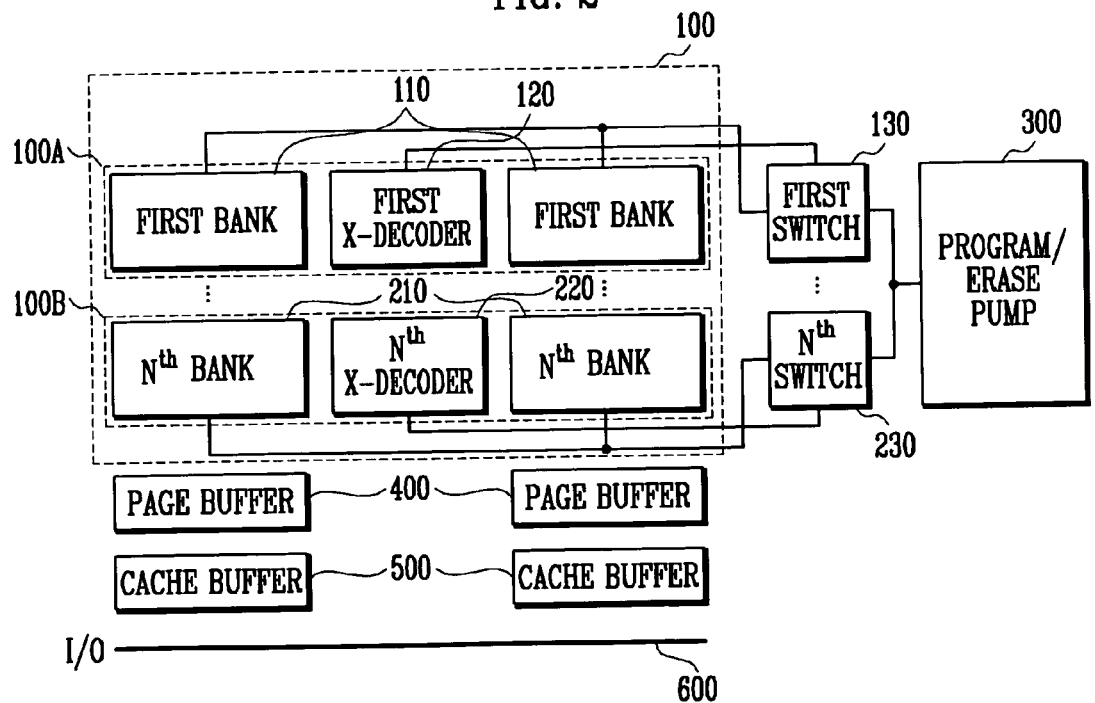
FIG. 2 is a block diagram illustrating the bank structure of a NAND flash memory according to an embodiment of the present invention.

FIG. 2 is a block diagram illustrating the back structure of a NAND flash memory according to an embodiment of the present invention.

Referring to FIG. 2, in the proposed chip architecture, one P-well 100 forming the whole memory cell array is physically divided into a first P-well region 100A to an $n^{th}$ P-well region 100B. First banks 110 are formed in the first P-well region 100A and $n^{th}$ banks 210 are formed in the $n^{th}$ P-well region 100B.

The first banks 110 to the $n^{th}$ banks 210 include page buffers 400 for paging data, and cache buffers 500. The cache buffers 500 share an I/O line 600.

A program/erase pump 300 generates a high voltage of 20V or more through a pumping operation. The generated high voltage is outputted to a first switch 130 to an $n^{th}$ switch 230.

The first switch 130 switches the high voltage output from the program/erase pump 300 according to program and erase operations and outputs the switched voltage to the first banks 110 and a first X-decoder 120.

At this time, the P-well 100A of the first banks 110 is applied with a high voltage of about 20V during the erase operation and is applies with about 0V during the program operation. In contrast, the first X-decoder 120 is applied with a voltage of 0V during the erase operation and is applied with 18V or 10V during the program operation, thereby driving the word lines of the memory cell array.

Voltages applied to the P-well 100A and the first X-decoder 120 of the first banks 110 are different as described above. Accordingly, the first switch 130 controls the voltage level of the high voltage, which is an output from the program/erase pump 300, according to the program and erase operations, and applies different voltages to the P-well 100A and the first X-decoder 120.

The first switch 130 performs a switching operation in response to control signals (e.g., a program operation signal, an erase operation signal, and a read operation signal)

The $n^{th}$ switch 230 switches the high voltage output from the program/erase pump 300 according to the program and erase operations, and outputs the switched voltage to the $n^{th}$ bank 210 and an $n^{th}$ X-decoder 220. The $n^{th}$ switch 230 have the same function as that of the first switch 130 and will not be described.

The first X-decoder 120 applies the voltage, which is an output from the first switch 130, to the word lines of the memory cell array within the first banks 110 by means of a decoding operation.

The $n^{th}$ X-decoder 220 applies the voltages, which is an output from the $n^{th}$ switch 230, to the word lines of the memory cell array within the $n^{th}$ bank 210 by means of a decoding operation.

The first banks 110 and the $n^{th}$ banks 210 are formed on different P-wells of the semiconductor substrate. This is because when the first banks 110 and the $n^{th}$ banks 210 perform different operations (for example, the first banks 110 perform the program operation and the $n^{th}$ banks 210 perform the erase operation), voltages applied to the P-wells of the semiconductor substrate must be different from each other. Accordingly, the first banks 110 and the $n^{th}$ banks 210 are formed on different P-wells (i.e., the first P-well 100A and the $n^{th}$ P-well 100B). That is, the first banks 110 and the $n^{th}$ banks 210 must be physically separated from each other.

The operation of the bank division apparatus of the flash memory device constructed above according to an embodiment of the present invention will be described below.

An example in which the first banks 110 perform the program operation and the $n^{th}$ banks 210 perform the erase operation will be described below in detail.

The program/erase pump 300 generates a high voltage of 20V or more through the pumping operation. The generated high voltage is an output to the first switch 130 and the $n^{th}$ switch 230. The first switch 130 switches the high voltage generated from the program/erase pump 300 and outputs the high voltage to the first X-decoder 120. The P-well 100A of the first banks 110 is applied with a voltage of 0V. At this time, the high voltage output to the first X-decoder 120 may be 18V or 10V.

The first X-decoder 120 decodes an address signal, selects the word lines of the memory cell array within the first banks 110, and outputs the high voltage, which is an output from the first switch 130, to the selected word lines. At the same time, received program data are transferred to the page buffer 400 through the I/O line 600 and the cache buffer 500. The page buffer 400 selects bit lines of a memory cell array to be programmed and transmits data. That is, a voltage level depending on the data is applied to the bit line of the cell array. The first banks are programmed according to the voltage level of the word lines and the bit line.

The $n^{th}$ switch 230 switches the high voltage generated from the program/erase pump 300 and applies the high voltage to the P-well 100B of the $n^{th}$ banks 210. The $n^{th}$ X-decoder 220 is applied with a voltage of 0V. At this time, the voltage applied to the P-well 100B of the $n^{th}$ banks 210 may be 20V or higher.

Accordingly, the P-well 100B of the $n^{th}$ bank 210 is applied with the high voltage. The word lines of the $n^{th}$ bank 210 are applied with a voltage of 0V by means of the $n^{th}$ X-decoder 220 or are floated, so that the memory cell array becomes an erase state.

As described above, in accordance with the present invention, a block of a flash memory is divided into n banks. When the read, program or erase operation is performed in one bank, the other operation is performed in the other bank. Accordingly, the operating speed of the flash memory device can be improved.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flash memory device comprising:
   first to $n^{th}$ banks sharing an I/O line;
   a page buffer unit commonly connected to a bit line of the first to $n^{th}$ banks, for buffering data to be transmitted to the first to $n^{th}$ banks;
   a first X-decoder connected to a word line of the first banks, for applying a driving voltage to the word line of the first banks;
   a $n^{th}$ X-decoder connected to a word line of the $n^{th}$ banks, for applying a driving voltage to the word line of the $n^{th}$ banks;
   a program/erase pump for generating a program voltage/erase voltage applied to the first to $n^{th}$ banks;
   a first switch unit that switches the program voltage/erase voltage and transmits the voltage to the first banks and the first X-decoder; and
   a $n^{th}$ switch unit that switches the program voltage/erase voltage and transmits the voltage to the $n^{th}$ banks and the $n^{th}$ X-decoder.

2. The flash memory device as claimed in claim 1, wherein the first to $n^{th}$ banks are provided in different P-wells that are physically separated.

3. The flash memory device as claimed in claim 1, wherein each of the first and $n^{th}$ switch units applies the program voltage/erase voltage to the first to $n^{th}$ banks, or controls a voltage level of the program voltage/erase voltage and applies the controlled voltage to the first to $n^{th}$ decoders, in response to control signals.

4. The flash memory device as claimed in claim 3, wherein the control signals include a program operation signal, an erase operation signal, and a read operation signal.

5. A flash memory device including a bank contained within one well of a semiconductor substrate and a decoder for gaining access to the bank, the flash memory device comprising:
   first and second wells that are formed by dividing the one well into two or more independent well;
   first and second banks which are separately formed in the first well and have at least ½ of the memory capacity of the bank;
   a first decoder formed in the first well, for gaining access to the first and second banks;
   third and fourth banks which are separately formed in the second well and have at least ½ of the memory capacity of the bank; and
   a second decoder formed in the second well, for gaining access to the third and fourth banks,
   wherein, when the first and second banks perform a program operation, the third and fourth banks perform an erase operation, and when the first and second banks perform the erase operation, the third and fourth banks perform the program operation.

* * * * *